United States Patent [19]

Niu et al.

[11] 4,300,032
[45] Nov. 10, 1981

[54] OUTPUT CONTROL APPARATUS FOR A MICROWAVE OVEN

[75] Inventors: Tokihide Niu, Osaka; Takayoshi Yuuzu, Higashi-Osaka; Ikuzo Abe, Ikeda; Koichi Shigematsu, Kawanishi, all of Japan

[73] Assignee: Matsushita Electric Industrial Co., Ltd., Osaka, Japan

[21] Appl. No.: 171,909

[22] Filed: Jul. 21, 1980

Related U.S. Application Data

[63] Continuation of Ser. No. 727,615, Sep. 28, 1976, abandoned.

[30] Foreign Application Priority Data

Oct. 2, 1975 [JP] Japan .................................. 50-119526
Oct. 2, 1975 [JP] Japan .................................. 50-119540

[51] Int. Cl.³ .............................................. H05B 6/66
[52] U.S. Cl. .................................. 219/10.55 B; 361/6
[58] Field of Search ..................... 219/10.55 B; 361/6

[56] References Cited

U.S. PATENT DOCUMENTS

| 3,560,796 | 2/1971 | Landis | .................................... 361/6 |
| 3,939,319 | 2/1976 | Tamano et al. | .............. 219/10.55 B |
| 4,017,702 | 4/1977 | Harmon et al. | .............. 219/10.55 B |

FOREIGN PATENT DOCUMENTS

1323551 7/1973 United Kingdom ......... 219/10.55 B

*Primary Examiner*—C. C. Shaw
*Attorney, Agent, or Firm*—Spencer & Kaye

[57] ABSTRACT

In an output control apparatus for a microwave oven, it is known to insert a control switch in the primary side of a power transformer of a magnetron. In this invention, the control switch is provided in the secondary side of the power transformer either in a magnetron circuit or in a rectifier circuit. The actuation of the control switch is controlled by an on-off control signal such that the control switch is opened and closed respectively within zero-current time periods, of a half-wave current which flows through the rectifier or the magnetron. A transient rush current to the transformer is reduced and reliable intermittent operation of the magnetron is assured.

2 Claims, 8 Drawing Figures

OUTPUT CONTROL APPARATUS FOR A MICROWAVE OVEN

This is a continuation of application Ser. No. 727,615 filed Sept. 28, 1976, now abandoned.

The present invention relates to an output control apparatus for a microwave oven for effecting on-off output control.

Heretofore, a control switch for selectively applying a high voltage to a magnetron to start or stop the oscillation thereof has been inserted in a primary (low voltage side) of a transformer. In operation, when the control switch is turned on, a voltage which is higher than a magnetron oscillation voltage is developed across a secondary of the transformer to start the oscillation of the magnetron, and when a power supply is turned off, the oscillation of the magnetron is stopped. However, during the operation of the control switch, a transient excitation rush current of the transformer (which may be ten times as high as a steady current depending on a turn-on phase) flows. As a result, in order to insure the reliability of the operation of the control switch, a switch of a high current capacity is required. At the same time, where a wiring of a small current capacity is involved, a significant voltage drop occurs by the rush current, which adversely affects other equipment. For example, in the control of defeezing of frozen food, when an oscillation irradiation energy from the magnetron is continuously applied in accordance with a change of dielectric losses of ice and water, partially defrozen water is locally heated resulting in non-uniform heating. To prevent the non-uniform heating, it has been proposed to temporarily repeat the start and stop of the oscillation of the magnetron until an entire object to be heated is heated substantially uniformly by thermal conduction. In such use of the microwave oven which requires many times of operations, the problem of the rush current further increases. Moreover, the magnetron must have its cathode heater continuously heated in order to conduct the oscillation, and hence a separate transformer for heating the cathode heater has been required.

It is an object of the present invention to provide an output control apparatus for a microwave oven, which reduces a rush current produced at the start and stop of the oscillation of the magnetron, enhances the reliability of repetitive start and stop operation of the magnetron while reducing the effects on other equipment, and reduces noise from arcs developed across switch contacts.

The invention will be described in detail below with reference to the accompanying drawings, in which.

The embodiments of the present invention are now explained with reference to the drawings.

Figure 1:
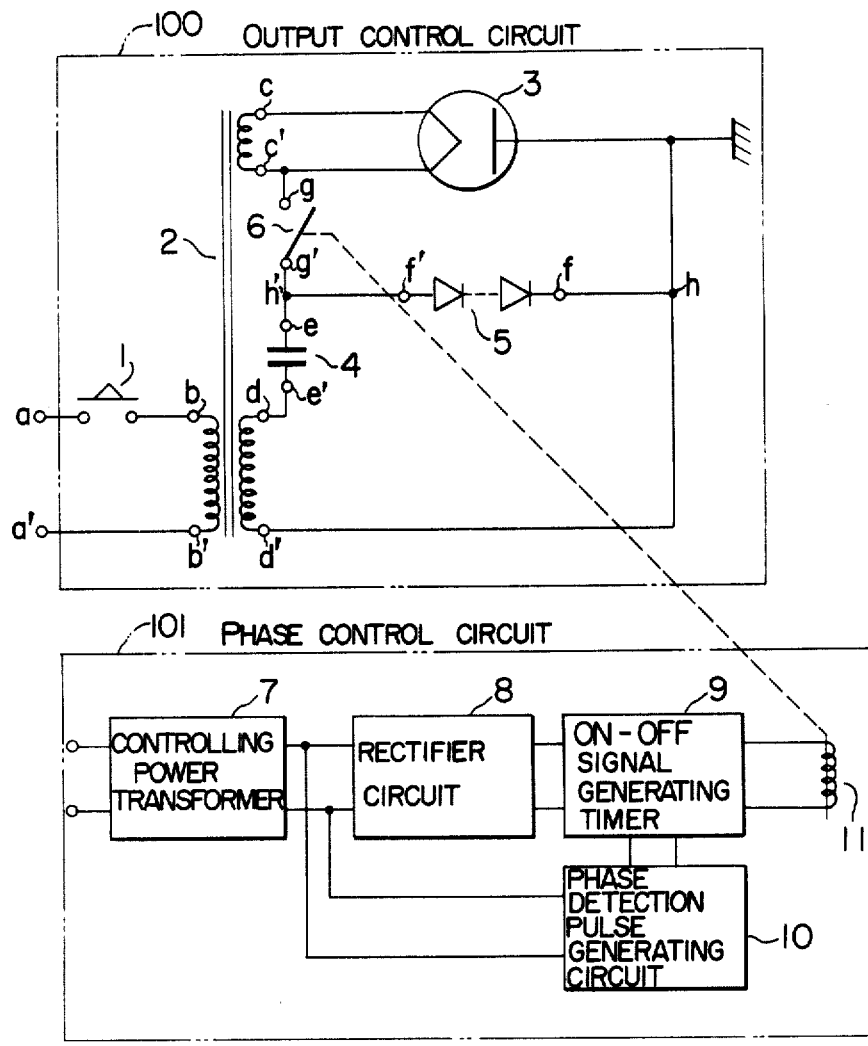
FIG. 1 is a schematic circuit diagram of one embodiment of the present invention.

FIG. 1 shows one embodiment of the present invention in which a half-wave current flowing through a magnetron is switched on and off. In FIG. 1, a block 100 shows an output control circuit of a microwave oven and a block 101 shows a phase control circuit for switching on and off a high voltage switch 6 in the block 100. More particularly, in FIG. 1, terminals a and a' are connected to an A.C power supply and a nominal voltage is applied across a primary (b-b') of a transformer 2 in the block 100 when a power switch 1 is closed. A secondary of the transformer 2 has terminals c and c' across which a nominal voltage required to heat a magnetron heater (the terminals c and c' being connected to a cathode heater circuit for a magnetron 3) and terminals d and d' for supplying a nominal voltage to a high voltage half-wave rectifying voltage-doubler circuit required for the oscillation of the magnetron 3. One terminal d' of the high voltage terminals is connected to the anode of the magnetron which is kept at a ground potential. The other terminal d is connected to one terminal e' of a capacitor 4, the other end e of which is connected to one terminal g' of the high voltage switch 6 and one terminal f' of a rectifier 5. The other end g of the high voltage switch 6 is connected to the cathode heater circuit of the magnetron 3 and the other end f of the rectifier 5 is connected to the anode of the magnetron 3. The block 101 in FIG. 1 includes a controlling power transformer 7 for the switching control circuit, a rectifier circuit 8, an on-off signal generating timer composed of, for example, an astable multivibrator 9, a phase detection pulse generating circuit 10 and an excitation coil 11 for the high voltage switch 6.

The operation of the microwave oven thus constructed is now explained. Assuming first that the high voltage switch 6 is in its closed condition, when the power switch 1 is closed, the power supply voltage (A.C. voltage) across the terminals a and a' is applied to the terminals b and b' of the transformer 2 as shown in FIG. 2a. Under this condition, a half-wave current as shown in FIG. 2b flows into the magnetron 3 through a path h-3-6-h', and a half-wave current as shown in FIG. 2b' flows into the rectifier 5 developing a voltage I shown in FIG. 2c across the nodes h and h'. When the current shown in FIG. 2b flows, the magnetron 3 oscillates to generate an electromagnetic wave to function as the microwave oven. When the high voltage switch 6 is then opened, no current flows into the magnetron 3 and the magnetron 3 ceases to oscillate. Under this condition, a voltage II shown in FIG. 2c is applied across the nodes h and h' and no substantial current flows into the rectifier 5. The output on-off control of the microwave oven by the switching of the high voltage switch 6 is now explained. In order to open or close the high voltage switch 6, an excitation current is passed or blocked through the excitation coil 11 in the block 101. The phase detection pulse generating circuit 10 operates such that in opening the high voltage switch 6, the time of opening is selected to be within the period $T_2$ during which the current flowing through the magnetron 3 is substantially zero, that is, within a time period during which the current flows through the rectifier 5 as shown in FIG. 2b', and in closing the high voltage switch 6, it is effected with a period $T_3$ during which the voltage across the nodes h and h' indicated by II in FIG. 2c is lower than an oscillation initiation voltage $V_o$ of the magnetron 3. In FIGS. 2b, b' and c, $T_o$ is equal to 1/f second where f(Hz) is the power supply frequency, $T_1$ represents the time period during which the current flows into the magnetron 3, $T_2$ represent the time period during which the current flows into the rectifier 5, $T_4$ represents the time period during which a voltage higher than the oscillation initiation voltage $V_o$ of the magnetron 3 appears, and $T_3$ represents the time period during which a voltage lower than $V_o$ appears, wherein $T_o = T_1 + T_2 = T_3 + T_4$. By controlling the phase of opening and closing of the high voltage switch 6 in the manner described above, where the high voltage switch 6 is repeatedly closed for time intervals $t_1$ and opened for time intervals $t_2$ within a cooking time period $t_o$ as shown in FIG. 3 by the on-off signal generating timer 9 in the block 101, no substantial arc develops across the contacts of the high voltage switch 6 because the opening of the high voltage switch 6 is always effected within the time period $T_2$ in FIG. 2b and the closing thereof is always effected within the time period $T_3$ in FIG. 2c. Accordingly, electromagnetic wave noise or current switching surges due to arcs do not occur. Furthermore, because there is no arc, no substantial consumption of the contacts by arc heating occurs, which assures long durability and high reliability. While the time intervals $t_1$ in FIG. 3 are designated as ON, it should be noted that the magnetron 3 actually repeats the on-off operation in accordance with the power supply frequency.

A detailed circuit of the block 101 and the operation thereof are described below.

Figure 4:
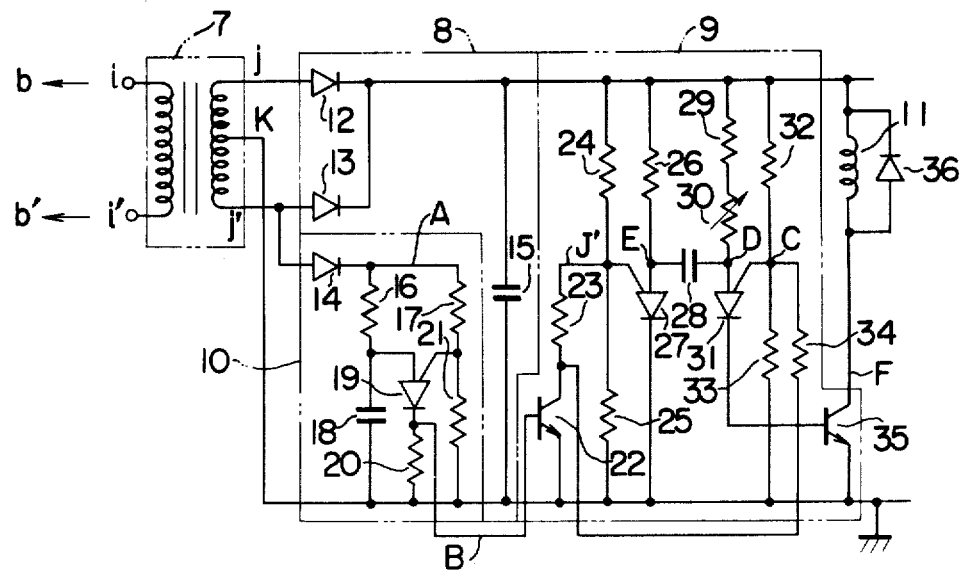
FIG. 4 is a detailed circuit diagram of a phase control circuit in this invention.

FIG. 4 shows the detailed circuit of the block 101 shown in FIG. 1, in which block 7 is a controlling power transformer, block 8 is a rectifier circuit, block 9 is on-off signal generating timer or an astable multivibrator with a variable oscillation frequency, and block 10 is a phase detection pulse generating circuit. Terminals i and i' of the primary of the controlling power transformer 7 are connected to the terminals b and b' in FIG. 1, respectively, and a center tap k in the secondary is grounded. Terminals j and j' of the secondary are connected to diodes 12 and 13 in the rectifier block 8, which full-wave rectify the secondary voltage, which is then filtered by a capacitor 15. The terminal j' of the secondary of the transformer 7 is also connected to a diode 14 in the phase detection pulse generating block 10, which half-wave rectifiers the secondary voltage. The phase detection pulse generating circuit comprises resistors 16, 17, 20, 21, a capacitor 18, and a programmable unijunction transistor (PUT) 19. The operation thereof is explained below. When the power supply is applied through the diode 14, the capacitor 18 is charged via the resistor 16. The PUT 19 having its gate terminal connected to the junction of the resistors 17 and 21 conducts when a voltage at an anode terminal thereof connected to the junction of the capacitor 18 and the resistor 16 becomes higher than the voltage at the gate terminal connected to the junction of the resistors 17 and 21. When the PUT 19 conducts, the charge previously stored in the capacitor 18 abruptly discharges through the resistor 20. At that moment, a narrow pulse is produced across the resistor 20. The phase at which the narrow pulse is produced is settable to any position in the half-wave by varying the magnitude of the resistance 16. Once it conducts, the PUT 19 remains conductive during the half-wave period and restores to non-conductive state after the completion of the half-wave period. The transistor 22 conducts when the pulse is produced across the resistor 20. The collector of the transistor 22 is connected via resistors 23 and 34 to a gate terminals of PUTs 27 and 31, respectively, of the astable multivibrator block 9 with variable oscillation frequency. The astable multivibrator comprises resistors 24, 25, 26, 29, 32, 33, a variable resistor 30, capacitor 28 and the PUTs 27, 31. The operation of the astable multivibrator is explained below.

Assuming that the PUT 27 is initially conducting. The capacitor 28 is charged through the resistor 29 and the variable resistor 30. Thus, the potential at point D (anode terminal of the PUT 31) gradually rises. When it exceeds the voltage divided by the resistors 32 and 33 (gate terminal voltage), the PUT 31 conducts to turn on the transistor 35. When the PUT 31 conducts, the positive terminal of the capacitor 28 (point D) becomes ground potential so that the anode terminal of the PUT 27 becomes negative to back-bias the PUT 27, which is then restored to the non-conductive state. When the PUT 31 conducts, the capacitor 28 start to charge through the resistor 26 so that the anode voltage of the PUT 27 rises. When it exceeds the voltage divided by the resistors 24 and 25 (gate voltage), the PUT 27 is rendered conductive to back-bias the PUT 31 so that it is restored to the non-conductive state. The above operation is repeated. When the PUT 31 conducts, the transistor 35 conducts to energize the coil 11 for actuating the high voltage switch 6, which is then closed. On the other hand, when the PUT 27 conducts, the PUT 31 is rendered non-conductive and the transistor 35 is also rendered non-conductive so that the exciting coil 11 for the high voltage switch 6 is deenergized to open the high voltage switch 6. Diode 36 acts to prevent a back voltage of the exciting coil 11. The time interval of the repetitive operation is determined by the conduction period of the PUT 27. That is, the open period of the high voltage switch 6 is determined by the resistors 29, the variable resistors 30 and the capacitors 28 and the voltage divided by the resistors 32 and 33, and the conduction period of the PUT 31 or the closure period of the high voltage switch 6 is determined by the resistor 26 and the capacitor 28 and the voltage divided by the resistors 24 and 25. The on-off cycle of the high voltage switch 6 can be varied by changing the variable resistor 30, and the resistor 26 may also be a variable resistor.

Figure 2:
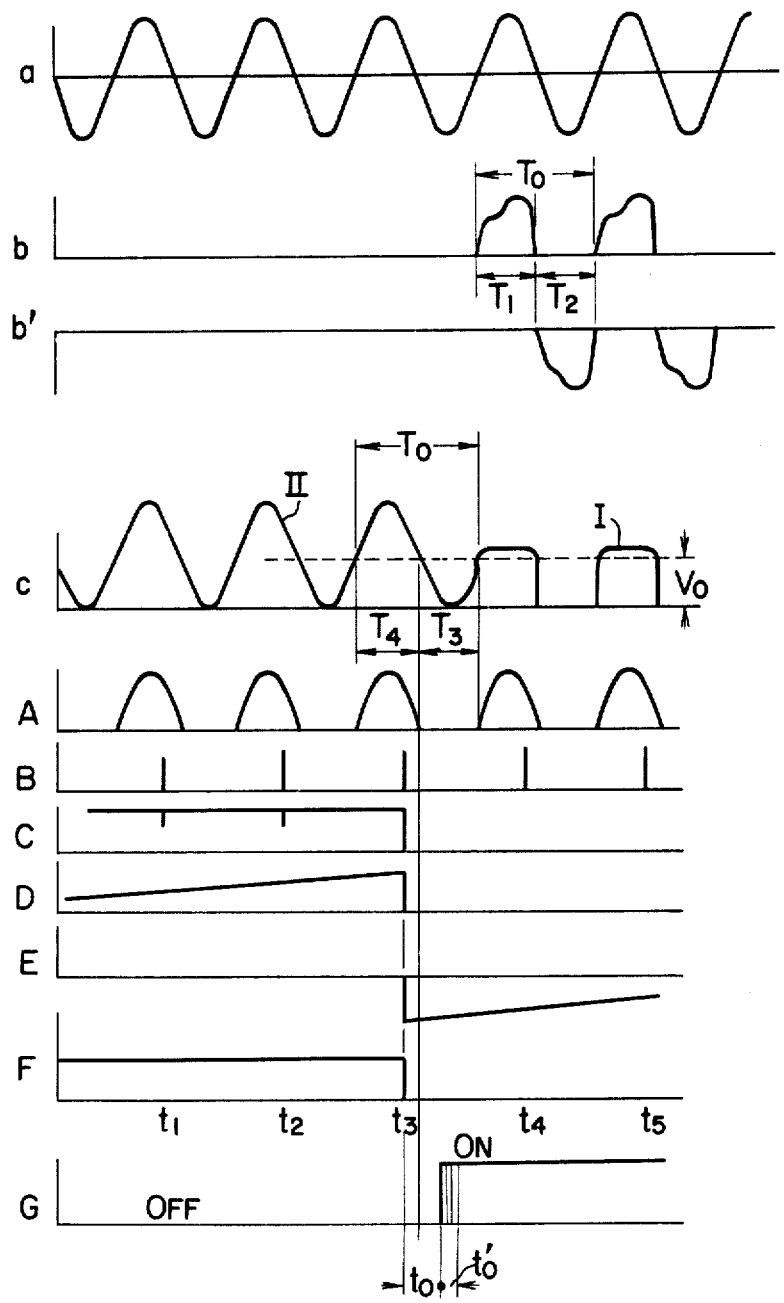
FIG. 2 shows waveforms at various points in the circuit diagram of FIG. 1, when a high voltage switch is actuated to close.
Figure 3:
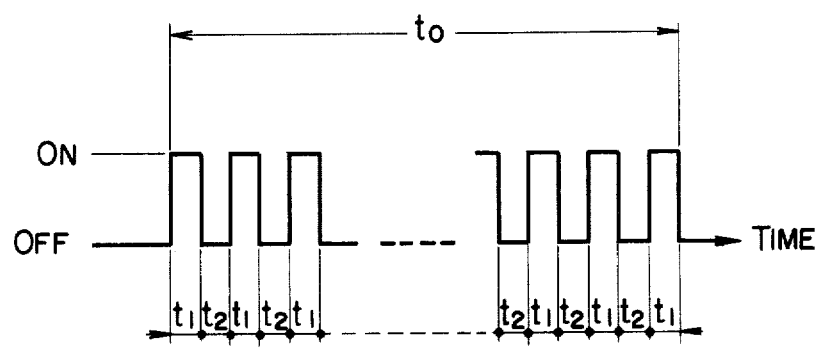
FIG. 3 illustrates on-off operation of a high voltage switch in this invention.

Referring to FIGS. 2 to 5, the correlations between the waveforms in the microwave oven and the phase detection pulse generating circuit and the astable multivibrator circuit are explained. FIG. 2 illustrates the operation in which the high voltage switch 6 switches from the open state, that is, the non-conduction state of the PUT 31 to the closed state. In FIG. 2, a shows the voltage waveform applied across the primary terminals b and b' of the transformer 2, b shows the current waveform flowing in the magnetron 3 through the high voltage switch 6, c shows the voltage waveform applied between the terminals f' and f (or h' and h) of the rectifier 5, A shows the half-wave rectified voltage waveform applied to A in FIG. 4, B shows the pulse waveform of the PUT 19, c shows the gate waveform of the PUT 31, D shows the anode voltage waveform of the PUT 31, E shows the anode voltage waveform of the PUT 27 and F shows the collector waveform of the transistor 35. G shows the waveform illustrating the open and closed conditions of the high voltage switch 6. As described before, the output pulse B can be set at any position in the half-wave of the waveform A. Since the waveform B is applied to the base of the transistor 22, a negative pulse appears at the collector thereof. This negative pulse is applied to the gates of the PUTs 27 and 31 through the resistors 23 and 34, respectively. Let assume that the high voltage switch 6 is in its open condition, that is, the PUT 31 is in its non-conductive condition. The gate potential of the PUT 31 is at the potential divided by the resistors 32 and 33. When the transistor 22 conducts, the resistor 34 is inserted in parallel with the resistor 33 so that the potential at the gate slightly drops. This waveform is shown by C. On the other hand, the waveform D gradually rises by the resistor 29, the variable resistor 30 and the capacitor 28. If a negative pulse externally applied at the time $t_3$ is lower than the voltage of the waveform D, the PUT 31 is forced to shift to the conductive state. When the PUT 31 conducts, the PUT 27 in turn repeats the exactly same operation.

Figure 5:
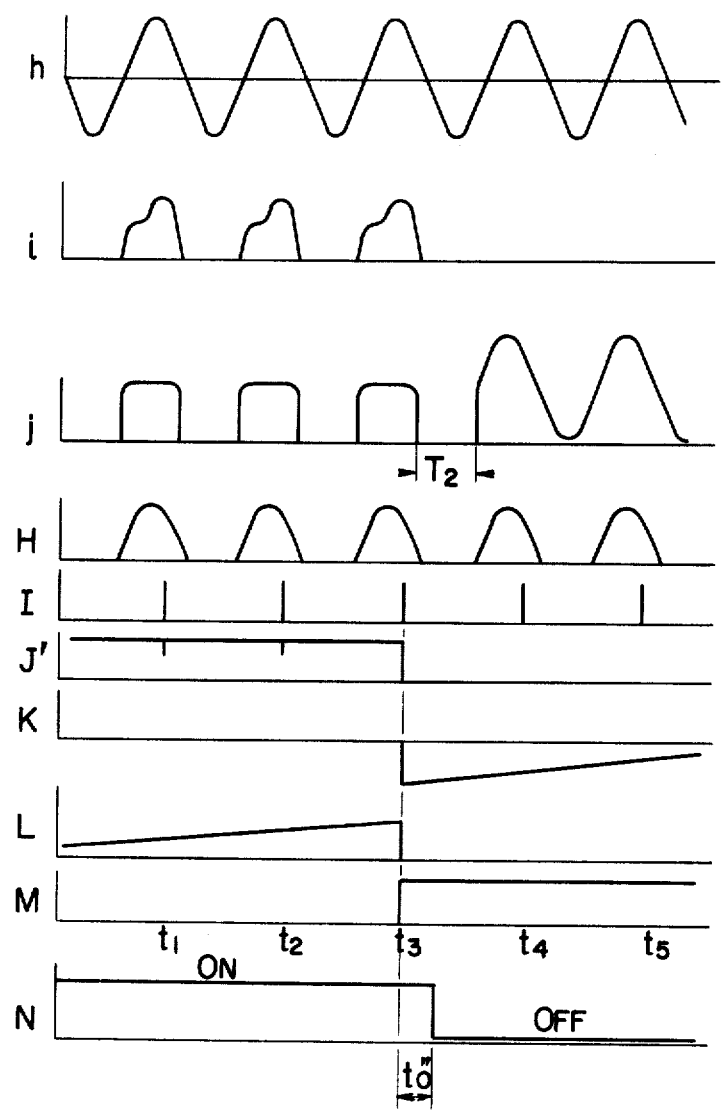
FIG. 5 shows waveforms similar to that of FIG. 2, when the high voltage switch is activated to open.

E illustrates that when the PUT 31 is shifted to the conductive state at time $t_3$, a back-bias is applied by the capacitor 28. It is back-biased by the amount substantially equal to the voltage divided by the resistors 32 and 33, and the capacitor 28 is charged thereby through the resistor 26. When the PUT 31 conducts, the transistor 35 also conducts to pass a current through the excitation coil 11 for the high voltage switch 6 to energize the coil 11. Thus, as shown in G, the high voltage switch 6 starts to close with the time delay $t_o$ from the time of current application to the excitation coil 11, and it reaches a completely closed condition after the chattering period $t_o'$ during the closing operation. By controlling the pulse waveform B which occurs upon detection of the phase of the half-wave voltage waveform A such that the time period $t_o'$ occurs within the time period $T_3$ during which a voltage lower than the oscillation initiation voltage of the magnetron 3 is produced, no substantial current flows during the closure operation of the high voltage switch 6 so that no arc and no noise are produced and little consumption of the contacts of the high voltage switch 6 occurs. Contrarily, FIG. 5 illustrates the operation of the high voltage switch 6 from its closed state to the open state. Waveform J' shows the waveform at the point J' in FIG. 4. Waveform N illustrates the switching of the high voltage switch from the closed condition to the open condition. At the instant when the PUT 27 becomes conductive, the PUT 31 becomes non-conductive and the transistor 35 also becomes non-conductive. As a result, the current to the excitation coil 11 for the high voltage switch 6 is blocked and the high voltage switch 6 switches from the closed condition to the open condition with the delay time $t_o''$ from the time of the switching of the transistor 35 to its non-conductive state. By controlling the pulse waveform I which occurs upon detection of the half-wave voltage waveform H such that the opening of the high voltage switch 6 occurs within the time period $T_2$ of FIG. 5j during which the current is zero, no substantial arc occurs between the contacts of the high voltage switch 6 during the opening operation thereof, and like in the closure operation, no noise occurs and little consumption of the contacts of the high voltage switch 6 occurs, assuring long durability. Here, the phase relations between the waveforms a, b, A in FIG. 2 and the waveforms h, i, H in FIG. 5 are explained. The phase shifts of the current waveforms b and i of the magnetron 3 relative to the power supply voltage waveforms a and h are very small and the phase shifts of the half-wave voltage waveforms A and H relative to the power supply voltage waveforms a and h are substantially zero. Accordingly it is easy to produce the phase control pulses by detecting the power supply voltage waveform. If the voltage waveform in a high voltage circuit such as the waveforms c and j in FIGS. 2 and 5 are to be detected, a problem of safety would occur because the phase detection circuit is a low voltage circuit and should be isolated from the high voltage circuit.

With the switch constructed above, the phase detection can be easily effected, and by the appropriate phase detection, no substantial arc occurs between the contacts of the high voltage switch during the switching operation thereof and the electromagnetic wave noise as well as the current surge during the switching operation can be prevented to assure long durability. Furthermore, since the transformer is continuously energized during the cook period of the microwave oven, the frequency of the energization of the transformer is reduced. In addition, since the transformer for heating the magnetron heater can be integrated with the power transformer, cost reduction is realized. By the use of the variable resistor in the astable multivibrator circuit as shown in FIG. 4, the open time period of the high voltage switch 6 can be continuously changed between the maximum open time period determined by the maximum resistance of the variable resistor 30, the resistor 29 and the capacitor 28 and the voltage divided by the resistors 32 and 33, and the minimum open time period determined by the minimum resistance of the variable resistor 30, the resistor 29 and the capacitor 28 and the voltage divided by the resistors 32 and 33, while keeping the closure time period of the high voltage switch 6 at a fixed period. For example, considering that 100% output is produced when the magnetron 3 is continuously fed, an average output when the closure period is 4 seconds and the open period is 1 second is 80% output, and the average output when the open period is 4 seconds 50% output, and it is 20% output when the open period is 16 seconds. In this manner, the average output can be changed to any desired value. A similar effect can also be obtained when the high voltage switch 6 shown in FIG. 1 is inserted between h and f or f' and h'.

Figure 6:
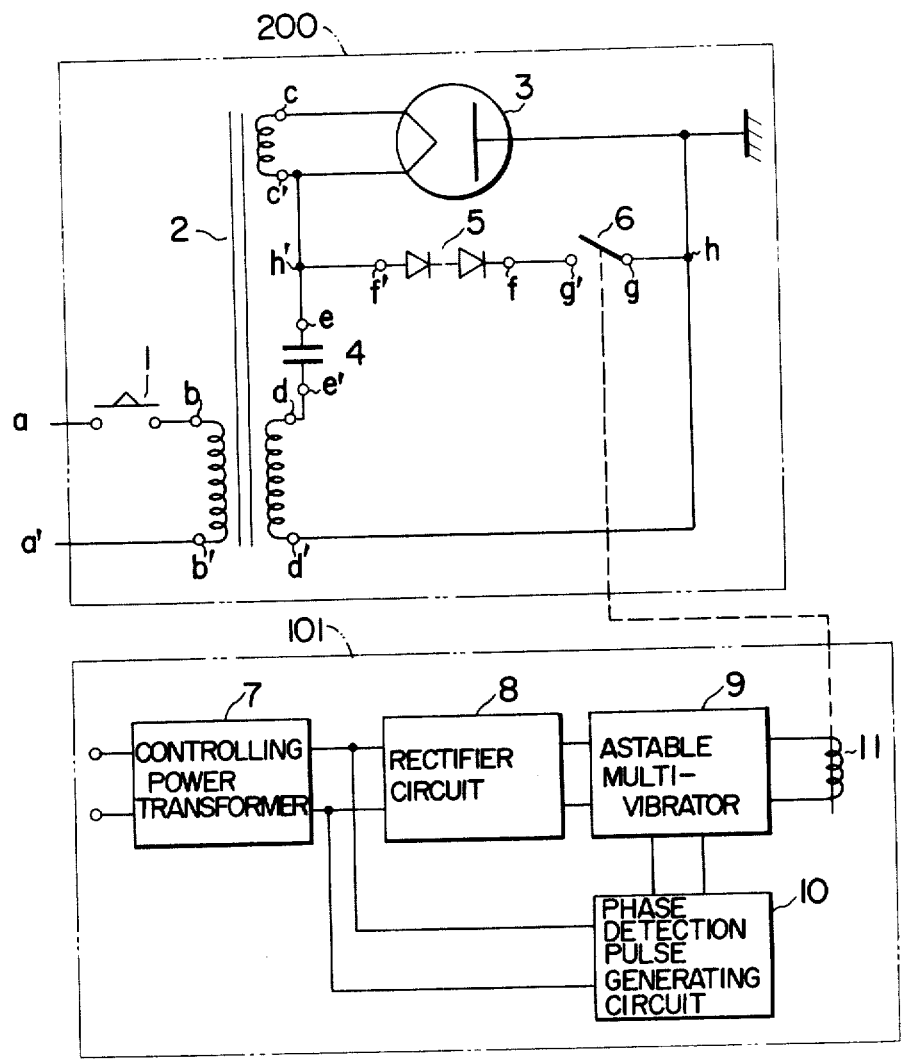
FIG. 6 is a schematic circuit diagram of another embodiment of the present invention.

FIG. 6 shows another embodiment of the present invention, which illustrates the on-off control of the half-wave current flowing through the rectifier. The high voltage switch may be connected directly to the positive polarity or negative polarity side of the rectifier in series thereto. In FIG. 6, the high voltage switch is connected to the negative polarity terminal of the rectifier, and the same reference numerals as in FIG. 1 are used to indicate the like parts. The difference from FIG. 1 is the position of the insertion of the high voltage switch 6. That is, the circuit of FIG. 6 includes the rectifier circuit comprising the rectifier 5 connected through the high voltage switch 6 and the capacitor 4, and the magnetron 3 is connected in parallel with the series-connected high voltage switch 6 and rectifier 5.

Figure 7:
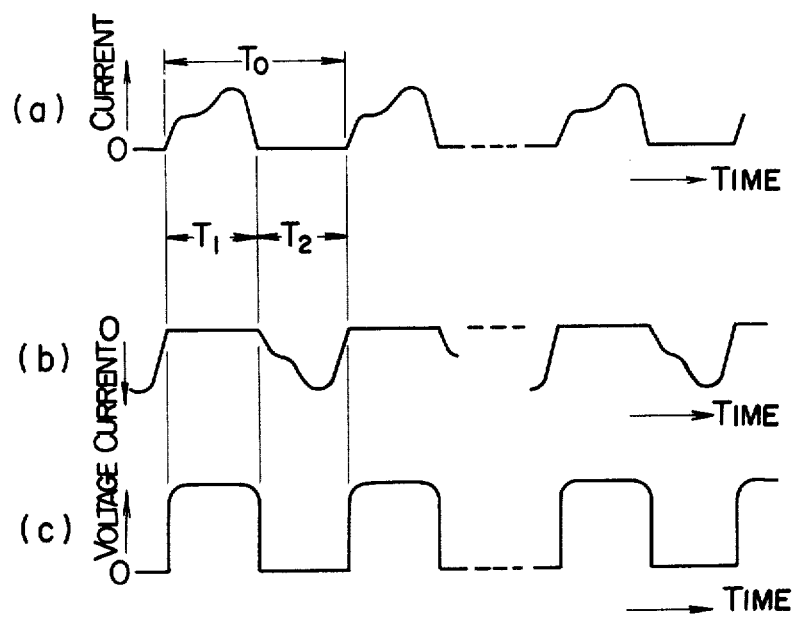
FIG. 7 shows waveforms of a current which flows through a magnetron.
Figure 8:
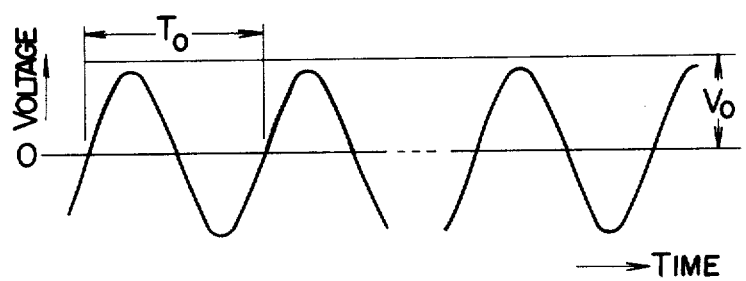
FIG. 8 shows a waveform of a voltage across a rectifier when the high voltage switch is opened.

The operation of the circuit of FIG. 6 is explained below. Assuming that the high voltage switch 6 is at its closed state, a nominal voltage is applied across the terminals b and b' of the transformer 2 by closing the power switch 1 to pass the power supply voltage (A.C. voltage) applied across the terminals a and a'. Under this condition, a half-wave current as shown in FIG. 7a flows into the magnetron 3 through a path h-3-h', and a half-wave current as shown in FIG. 7b flows through a path h-6-5-h'. Under this condition, a voltage as shown in FIG. 7c is applied across the nodes h and h', and the magnetron 3 oscillates when a current shown in FIG. 7a flows, to generate an electromagnetic wave for acting as the microwave oven. When the high voltage switch 6 is opened, no current flows through the rectifier 5. In this case, a voltage as shown in FIG. 8 is applied across the nodes h and h'. Since this voltage is lower than the oscillation initiation voltage $V_o$ of the magnetron 3, no substantial current flows through the magnetron 3 and it stops oscillating. The output on-off control of the microwave oven by the switching of the high voltage switch 6 is now explained. In order to close or open the high voltage switch 6, an exciting current is passed or blocked through the excitation coil 11 in the block 101. The phase control circuit 10 operates such that the timing of the closure and open of the high voltage switch 6 occurs within the time period during which the current flows through the magnetron 3. In FIGS. 7a, b, c and FIG. 8, $T_o$ equals to 1/f second where f(Hz) is a power supply frequency, $T_1$ represent the time period during which the current flows through the magnetron 3, $T_2$ represents the time period during which the current flows through the high voltage switch 6 to the rectifier 5, where $T_o = T_1 = T_2$. By controlling the phase of the closing and opening of the high voltage switch 6, where switch 6 is closed for the time interval $t_1$ within the cook period $t_o$ and opened for the time interval $t_2$, as shown in FIG. 3, by the on-off signal generating timer 9 of the block 101, is effected, the turn on and off of the high voltage switch 6 is always effected within the time period $T_1$ during which the current flows through the magnetron 3, that is, within the time period during which no current flows through the high voltage switch 6. Accordingly, no substantial arc occurs between the contacts of the high voltage switch 6 and no electromagnetic wave noise and no current surge during the switching occurs. Furthermore, because of no arc, there is no substantial consumption of the contacts due to the arc, assuring long durability and high reliability. The same effects are obtained when the high voltage switch 6 is connected directly to the positive polarality terminal of the rectifier 5, namely between the terminals h' and f' in FIG. 6. A detailed description of the operation of the phase control circuit 101 is not presented for this embodiment since the phase relationships of the magnetron current waveform and the rectifier half-wave current waveform (shown respectively in FIGS. 7(a) and 7(b)) and the voltage waveform across the rectifier shown in FIG. 8 with respect to the power supply voltage waveform at the primary side of the power transformer (between terminals b and b' in FIG. 1) do not vary significantly from the previous embodiment it is possible with this embodiment to phase control the on-off phase of the high voltage switch by detecting the voltage waveform of the power supply voltage and by generating a phase detection pulse as in the embodiment of FIG. 1.

As will be apparent from the above description, according to the output control apparatus for the microwave oven of the present invention, there is no substantial rush current due to the energization of the transformer and hence the affect to other equipment is reduced. Furthermore, the need for a separate heater transformer for the magnetron heater is eliminated because the heater transformer can be integrated with the power transformer, thus reducing the cost. Where the on-off control by the power switch 1 as shown in FIG. 4 is effected, the prior art system required about two seconds from the closure of the power switch 1 to the steady state of the energy generated from the magnetron 3, but the present invention requires about 1/f second (f(Hz) being the power supply frequency) after the closure of the high voltage switch 6. Thus, the time required to reach the steady state in the present invention is short, moreover, since there is no arc occurred between the contacts of the switch when it is turned on or off, no electromagnetic wave noise and no current surge occurs, assuring long durability and high reliability.

What is claimed is:

1. An output control apparatus for a microwave oven comprising:
   a rectifier circuit having a serially connected rectifier element and a capacitor connected to a secondary winding of a transformer, the primary winding of said transformer being connected to a voltage source;
   a magnetron having an anode and a cathode connected to an output side of said rectifier circuit, a filament of said magnetron being connected to a third winding of said transformer;
   a high voltage mechanical switch having a pair of contacts actuated by an exciting coil connected between the cathode of said magnetron and the junction of said capacitor and said rectifier element; and
   a phase control circuit including said exciting coil coupled to said high voltage mechanical switch for generating an on-off control signal and for controlling the actuation of said high voltage mechanical switch, said phase control circuit further including;
   a phase detection pulse generating circuit having an input terminal connected to the primary winding of said transformer for detecting the voltage phase of said voltage source and for generating a pulse signal having a predetermined phase relationship with said voltage phase, and
   an on-off signal generating timer circuit connected to said phase detection pulse generating circuit for generating said on-off control signal in response to said pulse signal, said timer circuit being responsive to said pulse signal to generate said on-off control signal to begin closing said high voltage mechanical switch after the lapse of a delay time ($t_0'$) required for actuating the contacts by an exciting current through said exciting coil and to complete closing said switch within a period during which the voltage across said rectifier is lower than the oscillation starting voltage of said magnetron, and to open said high voltage mechanical switch after lapse of a delay time ($t_0''$) required for actuating the contacts and within a half-wave time period during which the polarity thereof permits no current to flow through said magnetron.

2. An output control apparatus for a microwave oven comprising:
   a rectifier circuit having a serially connected rectifier element and a capacitor connected to a secondary winding of a transformer, the primary winding of said transformer being connected to a voltage source;
   a magnetron having an anode and a cathode connected to an output side of said rectifier circuit, a filament of said magnetron being connected to a third winding of said transformer;

a high voltage mechanical switch having a pair of contacts actuated by an exciting coil connected to said rectifier circuit in series with said rectifier element, said serially connected rectifier element and high voltage mechanical switch being connected in parallel with said magnetron; and a phase control circuit coupled to said high voltage mechanical switch for generating an on-off control signal and for controlling the actuation of said high voltage mechanical switch, said phase control circuit including;

a phase detection pulse generating circuit having an input terminal connected to the primary winding of said transformer for detecting the voltage phase of said voltage source and for generating a pulse signal having a predetermined phase relationship with said voltage phase, and an on-off signal generating timer circuit connected to said phase detection pulse generating circuit for generating said on-off control signal in response to said pulse signal, said timer circuit being responsive to said pulse signal to generate said on-off control signal to begin closing said high voltage mechanical switch after the lapse of a delay time required for actuating the contacts by an exciting current through said exciting coil and to complete closing said switch within a time period in which the voltage applied to said high voltage switch is substantially zero, and to open said high voltage mechanical switch after the lapse of a delay time required for actuating the contacts and within a half-wave time period in which a polarity thereof permits a current to flow through said magnetron.

* * * * *